United States Patent [19]

Machida

[11] 4,185,378
[45] Jan. 29, 1980

[54] METHOD FOR ATTACHING COMPONENT LEADS TO PRINTED CIRCUIT BASE BOARDS AND PRINTED CIRCUIT BASE BOARD ADVANTAGEOUSLY USED FOR WORKING SAID METHOD

[75] Inventor: Hideo Machida, Saitama, Japan

[73] Assignee: Chuo Meiban Mfg. Co., LTD., Saitama, Japan

[21] Appl. No.: 877,555

[22] Filed: Feb. 10, 1978

[51] Int. Cl.² .............................................. H05K 3/04
[52] U.S. Cl. ........................................ 29/626; 29/628; 29/630 D; 174/68.5; 361/400; 361/403; 361/406
[58] Field of Search ............ 174/68.5; 29/626, 630 D, 29/628; 361/400, 403, 406

[56] References Cited

U.S. PATENT DOCUMENTS

| 3,022,480 | 2/1962 | Tiffany | 174/68.5 |
| 3,275,736 | 9/1966 | Hotine et al. | 29/626 |
| 3,528,173 | 9/1970 | Gall | 174/68.5 |
| 3,619,478 | 11/1971 | Staiger | 29/626 |
| 3,745,513 | 7/1973 | Gross | 174/68.5 |
| 3,832,769 | 9/1974 | Olyphant | 174/68.5 X |
| 3,882,264 | 5/1975 | Travis | 29/626 |
| 3,893,233 | 7/1975 | Glover | 29/628 |
| 4,086,426 | 4/1978 | Knappenberger | 174/68.5 |

FOREIGN PATENT DOCUMENTS 1246840  8/1967  Fed. Rep. of Germany .......... 174/68.5
1814805 10/1970  Fed. Rep. of Germany .......... 174/68.5

Primary Examiner—Richard R. Kucia
Assistant Examiner—J. Bouchard
Attorney, Agent, or Firm—Wenderoth, Lind & Ponack

[57] ABSTRACT

A printed circuit base board comprising an insulating substrate having a thin electric circuit layer composed of an electrically conductive material on one surface is disclosed. This printed circuit base board is drilled at parts of the insulating substrate contiguous to component lead attaching land-forming portions of the electric circuit layer from the opposite surface of the printed circuit base board, while leaving the land-forming portions undrilled, so that composite lead-inserting holes having a size sufficient to insert component leads exactly therein and having one end closed on the side of the land-forming portions of the electric circuit layer and the other end opened are formed. Component leads are inserted in these component lead-inserting holes from the open ends thereof, the top ends of these component leads are extended through the land-forming portions to project the top ends of the component leads on the printed circuit base board, and these projected top ends of the component leads are soldered to the land-forming portions of the electric circuit layer.

7 Claims, 17 Drawing Figures

METHOD FOR ATTACHING COMPONENT LEADS TO PRINTED CIRCUIT BASE BOARDS AND PRINTED CIRCUIT BASE BOARD ADVANTAGEOUSLY USED FOR WORKING SAID METHOD

BACKGROUND OF THE INVENTION

1. Field of the Invention

The present invention relates to an improvement in the method for attaching leads of electronic components to a printed circuit base board and to a printed circuit base board that can be advantageously used for working this improved method.

2. Description of the Prior Art

In general, a printed circuit base board is formed by attaching electrically conductive thin strips for connecting components of an electronic appliance to one surface of an electrically insulating substrate, and printed circuit base boards of this type are industrially manufactured by the copper laminate etching process (for example, the photoresist method, the silk screen method, the offset method, the rubber plate method and the electrophotographic method). Resistors, capacitors, transistors, diodes and other electronic components of electronic appliances are attached to this printed circuit base board according to an electric circuit pattern formed on one surface of the base board.

Components of electronic appliances have heretofore been attached to these printed circuit boards according to the procedures illustrated in FIGS. 1 and 2. More specifically, bores 4 are formed in the printed circuit base board 1 comprising an electrically insulating substrate 2 and a copper foil 3 laid out on one surface of the substrate 2 according to a desired electronic circuit pattern, at component attachment positions A so that leads 5 of the electronic appliance components (referred to as "component leads" in the instant specification and appended claims) can be inserted into these bores 4 and soldered to the printed circuit base board 1 as thus inserted, and component-attaching lands 3a are formed on the peripheral edges of one opening 4b of these bores 4. Then, the component leads 5 are inserted into the bores 4 from the reverse surface of the printed circuit base board 1, namely from the other openings 4a of the bores 4 so that these component leads 5 project from the front surface of the printed circuit base board 1. Then, the projected portions 5a of the component leads 5 are soldered to the component-attaching lands 3a formed of the copper foil 3 around the openings 4b of the bores 4 on the front surface of the printed circuit base board 1.

The above-mentioned bores 4 are ordinarily formed by press processing or drilling. These bores are generally formed with certain dimension allowances for errors in the drilling operation, shrinkage of printed circuit base boards and deviations in the thickness of component leads owing to differences of types and manufacturers with due consideration to facilitation of the operation of inserting components leads into the bores.

Accordingly, as conceptually shown in FIG. 2, slight clearances or gaps are ordinarily formed between the side walls of the bores 4 and the component leads 5 when the leads 5 are inserted into the bores 4. Because of the presence of such clearances, in the conventional attachment method, the following disadvantages are brought about during or after the attachment operation.

In the practical attachment process line, the above-mentioned operations of insertion and soldering of component leads into the bores are performed by an automatic soldering machine. In this soldering process, because of the presence of these clearances or gaps and/or because of a gas generated from the insulating substrate by the action of the heat for the soldering operation, the solder is caused to partially fall out. Namely, a so-called tunnel phenomenon (formation of defects such as holes 6a shown in FIG. 3) often occur.

This tunnel phenomenon results in insufficient electric contact between the component leads and the component lead-attaching lands. Therefore, these defects should be eliminated by a correcting operation after the soldering step. Accordingly, in the above-mentioned automatic soldering operation, it is indispensable to check for formation of tunnel defects and perform a correcting operation for eliminating these defects, and these troublesome additional operations require much labor and time and hinder attainment of the labor-saving effect of the soldering process.

As means for eliminating the foregoing disadvantage, there have been proposed and utilized a one-surface bore method and a bore plating method. These methods, however, are not suitable for the manufacture of commercial circuits because the productivity is very low, and they are not advantageous from the economic viewpoint.

As pointed out hereinbefore, the presence of the gaps between the side walls of the bores and the component leads results in the above-mentioned insufficient electric contact between the component lead-attaching lands and the component leads attached thereto by the automatic soldering operation or the like. Still further, if the above-mentioned gaps are present, no complete attachment is attained by simple soldering and breakages of the leads are readily caused by external forces such as vibrations. Accordingly, no sufficient electric or functional reliability can be attained and the durability, for example, the vibration resistance, is poor.

Moreover, in the conventional attachment method, in order to assure a satisfactory soldering effect, a solder mask (resist) 7 should be formed on the land 3a for attachment of the component lead 5 while the entire surface of the land 3a is kept in the uncoated exposed state. Accordingly, the circuit density cannot be enhanced and it is impossible to obtain a compact printed circuit.

OBJECT OF THE INVENTION

It is primary object of the present invention to provide a method for attaching component leads to a printed circuit base board, in which the foregoing disadvantages of the conventional methods are eliminated.

Another object of the present invention is to provide a method for attaching component leads to a printed circuit base board, in which the occurrence of the above-mentioned tunnel phenomenon is prevented in the soldered portions of the component leads.

Still another object of the present invention is to provide a method for attaching component leads to a printed circuit base board, in which a printed circuit having high electric reliability and good durability can be manufactured in a high operation efficiency.

A further object of the present invention is to provide a method for attaching lead components to a printed circuit base board, in which it is possible to produce a compact printed circuit with enhanced circuit density.

A further object of the present invention is to provide a printed circuit base board which can be advantageously used for working the foregoing methods.

Other objects and advantages of the present invention will be apparent from the detailed description given hereinafter.

BRIEF SUMMARY OF THE INVENTION

In accordance with the present invention, there is provided a method for attaching component leads to printed circuit base boards, which comprises drilling a printed circuit base board comprising an insulating substrate having a thin electric circuit layer composed of an electrically conductive material on one surface at parts of the insulating substrate contiguous to component lead attaching land-forming portions of said electric circuit layer from the opposite surface of the printed circuit base board, while leaving these land-forming portions undrilled, thereby to form composite lead-inserting holes having a size sufficient to insert component leads exactly therein and having one end closed on the side of these land-forming portions of the electric circuit layer and the other end opened, inserting component leads into these inserting holes from the open ends thereof, extending the top ends of the component leads through the land-forming portions to project the top ends of the component leads from the printed circuit base board, and soldering these projected top ends of the component leads to said land-forming portions of the electric circuit layer.

DETAILED DESCRIPTION OF THE PREFERRED EMBODIMENTS

The present invention will now be described in detail by reference to preferred embodiments illustrated in the accompanying drawing.

Figure 1:
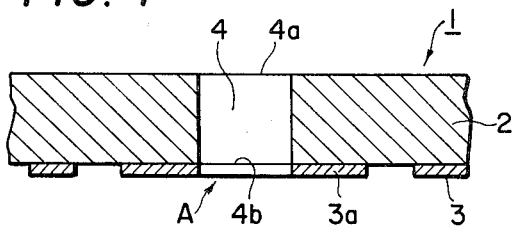
FIG. 1 is an enlarged sectional view illustrating a component lead-attaching portion of a conventional printed circuit base board.
Figure 2:
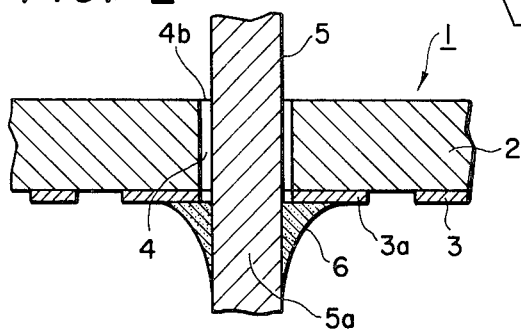
FIG. 2 is an enlarged sectional view illustrating the state in which a component lead is attached to the lead-attaching portion shown in FIG. 1.
Figure 3:
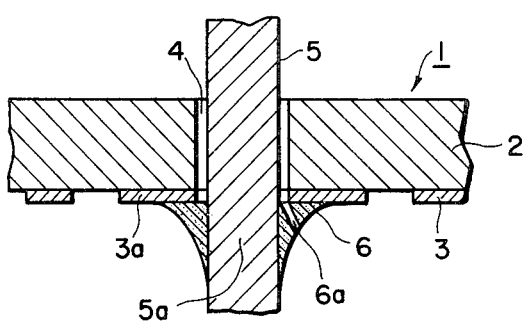
FIG. 3 is an enlarged sectional view showing the tunnel phenomenon after the step of soldering component leads to the lead-attaching portions shown in FIG. 2.
Figure 4:
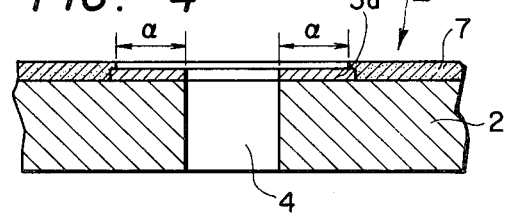
FIG. 4 is an enlarged view illustrating the state of a solder mask on the conventional printed circuit base board.
Figure 5:
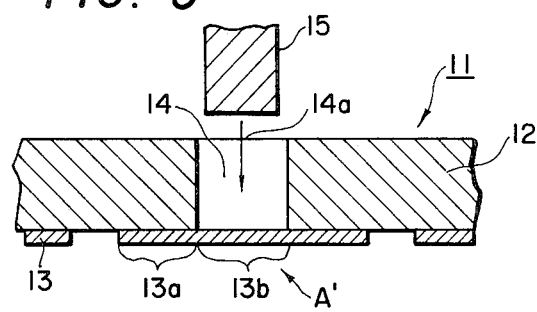
FIG. 5 is an enlarged sectional view illustrating a component lead-attaching portion of the printed circuit base board of the present invention.

The most characteristic feature of the present invention is that while according to the conventional technique, as shown in FIG. 1, bores 4 piercing not only the insulating substrate 2 but also the electrically conductive material 3 applied on the surface of the substrate 2 are formed at component lead-attaching portions A (component lead attaching land-forming portions) of the printed circuit base board 1 for attachment of component leads, according to the present invention, as shown in FIG. 5, the conductive layer is not drilled at component lead attaching land-forming portions A' but is left undrilled and predetermined holes 14 are selectively formed by drilling only the insulating substrate 12, whereby component lead-inserting holes 14 are formed so that one end of the respective holes 14 is closed by the conductive layer of the attaching land-forming portions A', namely holding plate portions 13b, and the other end of the respective holes 14 is opened.

Figure 6A:
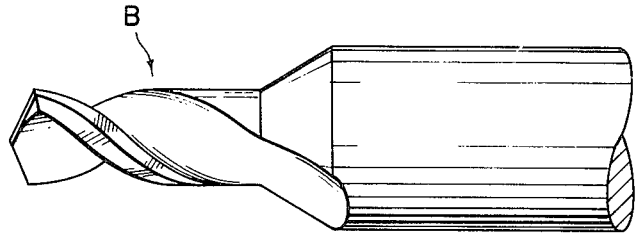
FIGS. 6-A and 6-B are respective plan and front views of a micro-drill to be used for formation of lead-inserting holes in the present invention.
Figure 6B:
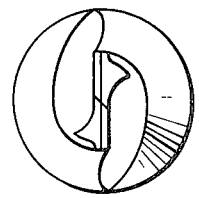

Drilling using a micro-drill as shown in FIGS. 6-A and 6-B may be the method for drilling the insulating substrate only at parts contiguous to the holding plate portions 13b of the conductive layer in the component lead attaching land-forming portions to form component lead-inserting holes 14 selectively at these parts of the insulating substrate, there for example.

The drilling operation for forming inserting holes 14 as shown in FIG. 5 selectively at parts of the insulating substrate contiguous to the conductive layer in the land-forming portions of the printed circuit base board using this micro-drill will now be described.

As shown in FIGS. 6-A and 6-B, the micro-drill that is used for formation of inserting holes has a top end configuration which is somewhat different from that of an ordinary piercing drill. As pointed out hereinbefore, in the present invention the purpose of the drilling operation is not to form bores but the conductive material layer should be left undrilled. In order to attain this feature, the micro-drill that is used in the present invention has a specific top end configuration. Namely, the blade edge A is relatively flattened so as not to form an excessively sharp blade end and the micro-drill has another blade portion B capable of forming a winecup-like shape which is effective for smooth insertion of a component lead into the resulting inserting hole.

The drilling operation may be accomplished by a computer-controlled automatic drilling system. Contrary to the conventional punching technique, drilling is effected from the back surface of the substrate where the conductive material is not present.

In the present invention, by the above-mentioned drilling operation, there are formed lead-inserting bores 14 having one end closed by holding plate portions 13b of attaching land-forming portions A. Referring to FIG. 5, the end of a component lead 15 is inserted into this lead-inserting bore 14 from the open end 14a thereof in a direction indicated by an arrow, and the end of the component lead 15 is pushed and thrust along the inserting bore 14. Thrusting is continued even when the end of the component lead 15 bears against the holding plate 13b of the attaching land-forming portion, so that the holding plate 13b is broken by the thrusting force, and the end of the component lead 15 finally projects from the front surface of the printed circuit base board 11.

Figure 7:
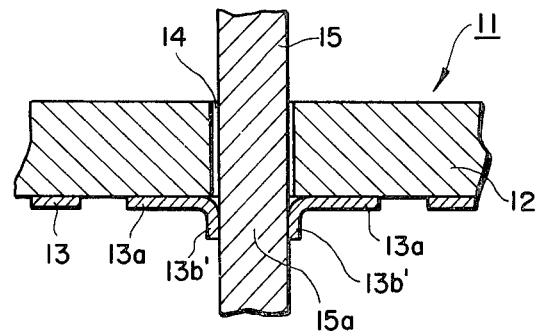
FIG. 7 is enlarged sectional view illustrating the state in which a component lead is inserted according to the present invention and is held by fragments of the holding plate which are formed by piercing the holding plate with the component lead.

By this inserting and thrusting operation, as shown in FIG. 7, the holding plate 13b of the attaching land-forming portion is broken and the resulting fragments 13b' of the holding plate 13b are bulged and bent toward the front surface of the printed circuit base board 11 to encircle and hold the projected portion 15a of the component lead 15.

Figure 8:
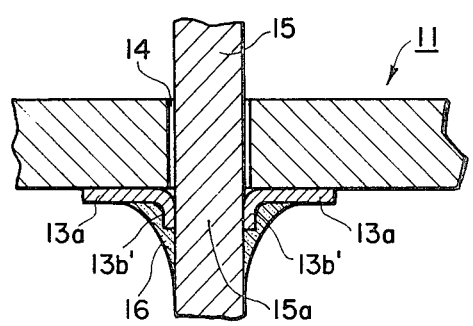
FIG. 8 is an enlarged sectional view illustrating the state in which a component lead is soldered to a lead-attaching land according to the present invention.

Then, as shown in FIG. 8, the projected portion 15a of the component lead 15 is soldered to the attaching land 13a so that the holding plate fragments 13b' encircling and holding the projected portion 15a of the component lead 15 are completely covered with solder 16.

Thus, the component leads 15 can be attached to the printed circuit base board 11 while electrically connecting the peripheral parts of the projected portions 15a of the component leads 15 to the attaching lands 13a.

As will be apparent from the foregoing illustration, according to the method of the present invention for attaching component leads to a printed circuit base board, holes for insertion of component leads are formed only at parts of the insulating plate contiguous to a land-forming conductive layer while leaving this land-forming conductive layer undrilled and the component leads pierce the holding plates of the undrilled land-forming conductive portion during the inserting step. Accordingly, fragments of the holding plates broken by the inserted component leads are bulged and bent toward the front surface of the printed circuit base board while encircling the projected portions of the component leads in the tightly contacted state. Therefore, these encircling fragments of the holding plates always hold tightly the projected portions of the lead components. In this tightly held state, the projected portions are soldered and hence, satisfactory soldering can be assured. Namely, fragments of the holding plates encircling the projected portions of the component leads facilitate spreading of the solder and the projected portions can be completely soldered.

The above-mentioned various disadvantages unavoidable in the conventional component lead-attaching methods because of the presence of clearances or gaps between component leads and the walls of the inserting bores can be completely eliminated according to the present invention. Further, component leads can be attached completely and tightly even by the customary automatic soldering operation and the occurrence of the tunnels can be completely prevented in the present invention. Therefore, various manual and troublesome correcting operations that should be conducted after the soldering step in the conventional methods need not be performed at all in the present invention.

Moreover, according to the present invention, complete soldering becomes possible and sufficient contact is brought about by the component lead-attaching portions. Accordingly, the electric characteristics are improved in a printed circuit formed according to the the present invention. Still further, since breakage of leads by vibrations or the like can be effectively prevented, the electric strength can be remarkably improved.

Since the reliability of the automatic soldering operation can be thus improved, the productivity of automatic insertion of component leads into inserting bores formed the printed circuit base board can be substantially enhanced and automation of this operation can be remarkably promoted.

Figure 9:
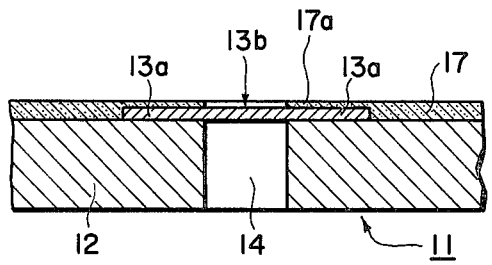
FIG. 9 is an enlarged sectional view showing the state in which a solder mask is formed on the printed circuit base board of the present invention.

In the present invention, since soldering is conducted on component leads held tightly by fragments of holding plates of the land-forming conductive portions, large escape areas such as adopted in the conventional methods in the solder masking operation to prevent bridging (formation of short circuits) during the soldering step, for example, escape areas having a width of 0.8 to 25$\mu$ or more to the substantial diameter of inserting holes, need not be formed. In some case, it is possible to form a solder mask 17 including a masking resist formed throughout the areas except the circular portions having a diameter corresponding to that of the inserting bores 14, namely a complete overcoat 17a (complete overcoat on areas of a high component density in IC, LSI or the like), as shown in FIG. 9. Thus, the solder masking effect can be remarkably improved, and the distance between two adjacent inserting bores can be reduced. Accordingly, the circuit density can be improved in designing printed circuits.

Synthetic resin insulating plates, especially laminated plates comprising a phenol-formaldehyde resin plate and a paper substrate, are ordinarily used as insulating substrates of printed circuit base boards. In addition, laminates comprising an epoxy resin, melamine resin, silicone resin or fluorine resin sheet and a glass cloth or a flexible thermoplastic resin plate can be used according to need. An electrically conductive material, typically a copper foil, is applied in a thickness of 0.01 to 0.2 mm, especially 0.035 to 0.1 mm, on the surface of this insulating substrate.

The copper foil constituting the attaching land-forming portions is very thin, and component leads are ordinarily composed of a copper wire having a diameter of about 0.5 and about 0.7 mm and they are relatively strong and stiff. Accordingly, when the component leads are inserted and thrust into the inserting bores, the copper foil constituting the holding plates of the attaching land-forming portions is readily broken by the thrusting force and the top ends of the component leads readily pierce the land-forming portions. According to need and preferably, in order to rupture the holding plates more easily and more certainly and/or to rupture the holding plates into fragments as uniform in the shape and size as possible, various contrivances as shown in FIGS. 10-A to 10-C may be made on the holding plates of the attaching land-forming portions.

Figure 10A:
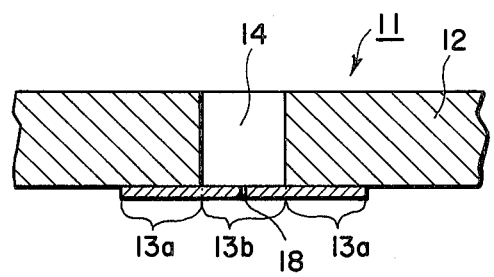
FIGS. 10-A, 10-B and 10-C are enlarged sectional views showing other embodiments of component lead-attaching portions of the printed circuit base board of the present invention.
Figure 10B:
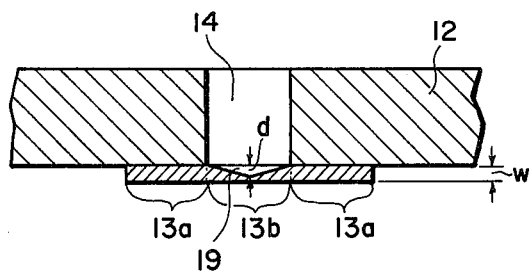
Figure 10C:
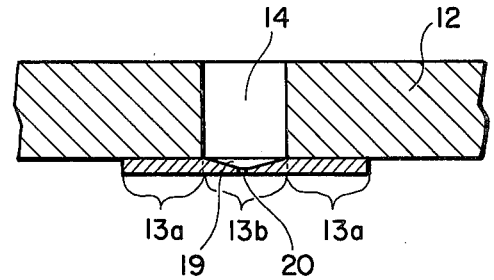

For example, as shown in FIG. 10-A, a guide bore 18 having a diameter smaller than the inserting bore 14 may be formed at the center of the holding plate 13b of the attaching land-forming portion covering one end of the inserting bore 14. The diameter of this guide bore 18 is not particularly critical and may be changed in a broad range depending on the method of inserting component leads into the inserting bores, the diameter of the component leads, the thickness of the holding plates and other factors. In general, however, the diameter of the guide bore 18 is adjusted to 2/10 to 8/10 of the diameter of the inserting bore 14 and preferably to 3/10 to 7/10 of the diameter of the inserting bore 14.

Further, as shown in FIG. 10-B, a concave face 19 may be formed on the surface of the holding plate 13b on the side of the inserting bore 14 so that the thickness is gradually decreased toward the center from the periphery of the bore 14. The maximum depth (d) of the concave face is preferably about 1/30 to about 1/20, especially 1/30 to 2/30, of the thickness of the copper foil constituting the holding plate.

Further, a guide bore 20 may be formed at the center of the concave face 19 as shown in FIG. 10-C. The diameter of this guide bore 20 may be 2/10 to 8/10, especially advantageously 3/10 to 7/10, of the diameter of the inserting bore 14, through the preferred diameter of the guide bore 20 varies depending on the depth of the concave face 19 and other factors.

When a guide bore is disposed in the holding plate and/or a concave face is formed by the holding plate as described above, rupture of the holding plate portion by the component lead can be remarkably facilitated. This guide bore 20 may be formed during the circuit pattern etching step.

In accordance with one preferred embodiment of the present invention, it has been found that when at least one line slit or cross line slit extending in a radial direction from the center of the holding plate is formed on the holding plate portion, the state of fragments can is uniform when the holding plate is broken by the component lead.

Figure 11A:
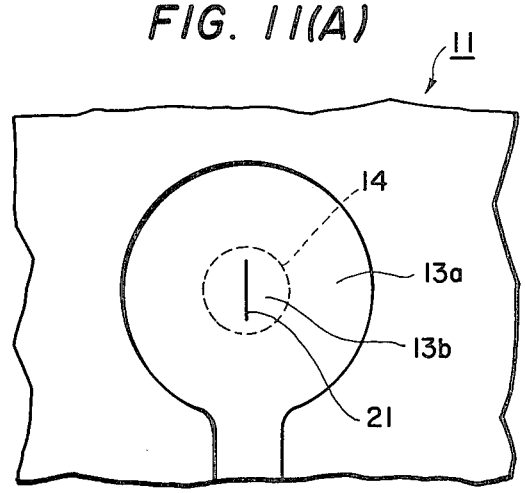
FIGS. 11-A, 11-B and 11-C are plan views showing embodiments of the printed circuit base board of the present invention where line slits or cross line slits are formed on the holding plates.
Figure 11B:
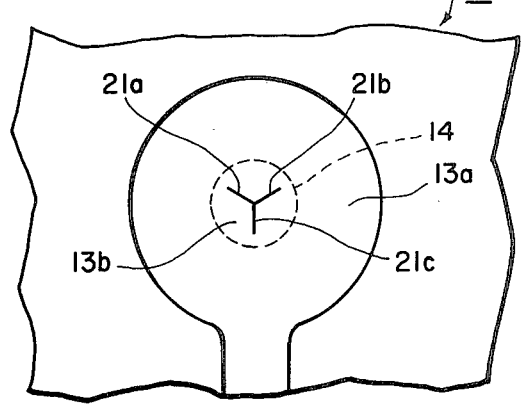
Figure 11C:
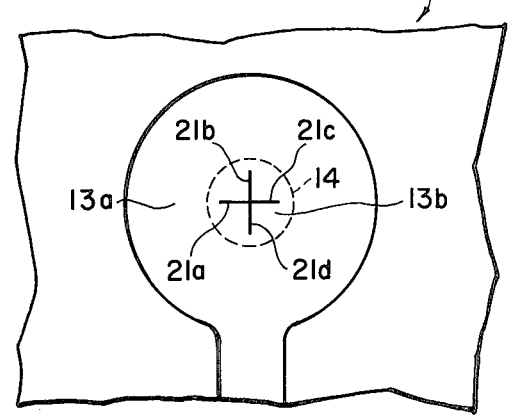

The number of these line slits or cross line slits formed in the holding plate is not particularly critical, but it can be changed in a broad range depending on the thickness of the holding plate and other factors. In general, however, good effects are obtained when 2 to 6 slits are formed. These slits may be arranged, for example, as shown in FIGS. 11-A to 11-C. Namely, a line slit or cross line slit 21 may be formed as one line passing through the center of the holding plate 13b as shown in FIG. 11-A. Further, three line slits or cross line slits 21a, 21b and 21c may be formed so that they extend from the center of the holding plate 13b in three directions, as shown in FIG. 11-B. Still further, four slits 21a, 21b, 21c and 21d extending from the center in four directions, in a cruciform pattern may be formed as shown in FIG. 11-C.

It is preferred that the length of these line slits or cross line slits be adjusted so that the ends reach the edge of the inserting bore 14 or is extended up to just before the edge of the inserting bore 14.

These line slits or cross line slits can be easily formed by a mechanical method or a chemical method such as photo-etching. For example, they may be formed simultaneously with formation of the circuit pattern.

When line slits or cross line slits are formed in the holding plates as described above, during the step of inserting the component leads 15 into the inserting bores 14, the holding plates 13b are always ruptured into fragments having a predetermined size and shape, and the peripheries of the projected portions 15a of the component leads 15 are always held in a homegeneous (free of deviations) and stable state by these fragments. Accordingly, the intended effects can be attained stably and certainly.

Figure 12:
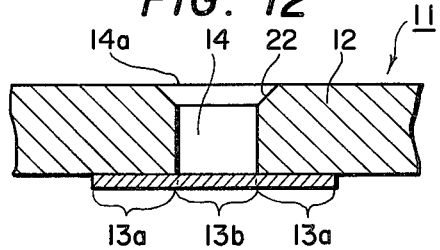
FIG. 12 is an enlarged sectional view showing a modification of the component lead-inserting holes in the printed circuit base board of the present invention.

In accordance with another preferred embodiment, a tapered guide portion 22 is formed on the open end 14a of the inserting bore 14 as shown in FIG. 12, whereby the operation of inserting the component lead 15 into the inserting bore 14 can be performed very easily and promptly and especially, the automatic inserting operation can be accomplished very certainly.

As will be apparent from the foregoing illustration, according to the present invention, the above-mentioned troubles and disadvantages in the conventional methods for attaching component leads to printed circuit base boards caused by the presence of gaps or clearances between the component leads and the inserting bores of printed circuit base boards can be eliminated. The electric reliability and operation efficiency of the attaching method of this type is remarkably improved and automation of the operation of attaching component leads to printed circuit base boards can be remarkably promoted. Still further, the pull strength (resistance against pulling) of component leads after soldering is drastically improved according to the present invention. More specifically, the pull strength is 7 to 8 kg/cm$^2$ in the present invention, whereas the pull strength is 3 to 4 kg/cm$^2$ in the conventional methods.

What we claim is:

1. A method for attaching component leads to a printed circuit board having an insulating substrate having first and second opposed surfaces and a thin electrically conductive layer on said first surface of said insulating substrate comprising the steps of:

drilling a hole from said second surface of said insulating substrate completely through said insulating substrate and partially into said thin electrically conductive layer leaving a portion of said thin electrically conductive layer to cover said hole formed thereby;

inserting a component lead into said hole in said insulating substrate from said second surface thereof;

projecting the end portion of said component lead through said thin electrically conductive layer to deform said portion of said thin electrically conductive layer outwards from said first surface of said insulating substrate; and soldering said end portion of said component lead to said thin electrically conductive layer including at least said deformed portion thereof.

2. A method according to claim 1, further comprising the step of:

forming a concave face on said at least a portion of said thin electrically conductive layer, after said drilling step.

3. A method for attaching component leads to a printed circuit board having an insulating substrate having first and second opposed surfaces and a thin electrically conductive layer on said first surface of said insulating substrate comprising the steps of:

drilling a hole from said second surface of said insulating substrate completely through said insulating substrate and partially into said thin electrically conductive layer forming a concave face in said thin electrically conductive layer and leaving a portion of said thin electrically conductive layer to cover said hole formed thereby;

inserting a component lead into said hole in said insulating substrate from said second surface thereof;

projecting the end portion of said component lead through said thin electrically conductive layer to deform said portion of said thin electrically conductive layer outwards from said first surface of said insulating substrate; and soldering said end portion of said component lead to said thin electrically conductive layer including at least said deformed portion thereof.

4. A method according to claim 3, wherein said at least a portion of said thin electrically conductive layer remaining after said drilling step has a thickness of between 34μ and 36μ.

5. A method according to claim 3, further comprising the step of:

drilling a guide hole in said at least a portion of said thin electrically conductive layer having a diameter less than the diameter of said component lead, after said drilling step.

6. A method according to claim 3, wherein said drilling step further comprises:
  drilling a guide hole in said at least a portion of said thin electrically conductive layer having a diameter less than the diameter of said component lead.

7. A method according to claim 3, further comprising the step of:
  forming at least one line slit passing through the axis of the hole formed by said drilling step in said at least a portion of said thin electrically conductive layer, after said drilling step.

* * * * *